(12) United States Patent
Lo et al.

(10) Patent No.: US 10,811,374 B2
(45) Date of Patent: Oct. 20, 2020

(54) INTERCONNECT STRUCTURE AND METHOD OF FORMING SAME

(71) Applicant: Taiwan Semiconductor Manufacturing Company, Ltd., Hsinchu (TW)

(72) Inventors: Hsiao Yun Lo, Hsinchu (TW); Lin-Chih Huang, Hsinchu (TW); Tasi-Jung Wu, Hsinchu (TW); Hsin-Yu Chen, Taipei (TW); Yung-Chi Lin, Su-Lin (TW); Ku-Feng Yang, Baoshan Township (TW); Tsang-Jiuh Wu, Hsinchu (TW); Wen-Chih Chiou, Zhunan Township (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 15/863,240

(22) Filed: Jan. 5, 2018

(65) Prior Publication Data

US 2018/0145046 A1    May 24, 2018

Related U.S. Application Data

(60) Continuation of application No. 15/613,579, filed on Jun. 5, 2017, now Pat. No. 10,157,866, which is a
(Continued)

(51) Int. Cl.
*H01L 23/00* (2006.01)
*H01L 23/48* (2006.01)

(52) U.S. Cl.
CPC ............ *H01L 24/05* (2013.01); *H01L 23/481* (2013.01); *H01L 24/03* (2013.01); *H01L 24/11* (2013.01); *H01L 24/13* (2013.01); *H01L 2224/0345* (2013.01); *H01L 2224/0346* (2013.01); *H01L 2224/0391* (2013.01); *H01L 2224/03462* (2013.01); *H01L 2224/03602* (2013.01); *H01L 2224/03614* (2013.01); *H01L 2224/03616* (2013.01); *H01L 2224/0401* (2013.01); *H01L 2224/05008* (2013.01); *H01L 2224/05012* (2013.01); *H01L 2224/05017* (2013.01);
(Continued)

(58) Field of Classification Search
CPC ......... H01L 24/05; H01L 24/13; H01L 24/03; H01L 24/11; H01L 24/25; H01L 24/82; H01L 24/24; H01L 2224/3225; H01L 2224/73267; H01L 2224/8203; H01L 2224/04105; H01L 2224/24226; H01L 2224/92244
See application file for complete search history.

(56) References Cited

U.S. PATENT DOCUMENTS

| 5,354,712 A | 10/1994 | Ho et al. |
| 7,867,787 B2 | 1/2011 | Gardner et al. |

(Continued)

*Primary Examiner* — Hoa B Trinh
(74) *Attorney, Agent, or Firm* — Slater Matsil, LLP

(57) ABSTRACT

A device includes a first side interconnect structure over a first side of a substrate, wherein active circuits are in the substrate and adjacent to the first side of the substrate, a dielectric layer over a second side of the substrate, a pad embedded in the dielectric layer, the pad comprising an upper portion and a bottom portion formed of two different materials and a passivation layer over the dielectric layer.

20 Claims, 4 Drawing Sheets

Related U.S. Application Data continuation of application No. 14/991,560, filed on Jan. 8, 2016, now Pat. No. 9,679,859, which is a division of application No. 14/158,364, filed on Jan. 17, 2014, now Pat. No. 9,252,110.

(52) U.S. Cl.
CPC .............. *H01L 2224/05025* (2013.01); *H01L 2224/05026* (2013.01); *H01L 2224/05082* (2013.01); *H01L 2224/05083* (2013.01); *H01L 2224/05124* (2013.01); *H01L 2224/05139* (2013.01); *H01L 2224/05147* (2013.01); *H01L 2224/05155* (2013.01); *H01L 2224/05166* (2013.01); *H01L 2224/05181* (2013.01); *H01L 2224/05184* (2013.01); *H01L 2224/05187* (2013.01); *H01L 2224/05565* (2013.01); *H01L 2224/05571* (2013.01); *H01L 2224/05624* (2013.01); *H01L 2224/05639* (2013.01); *H01L 2224/05647* (2013.01); *H01L 2224/05655* (2013.01); *H01L 2224/05684* (2013.01); *H01L 2224/1145* (2013.01); *H01L 2224/11334* (2013.01); *H01L 2224/11462* (2013.01); *H01L 2224/131* (2013.01); *H01L 2224/13023* (2013.01); *H01L 2224/13026* (2013.01); *H01L 2224/13111* (2013.01); *H01L 2224/13147* (2013.01); *H01L 2924/00012* (2013.01); *H01L 2924/00014* (2013.01); *H01L 2924/013* (2013.01); *H01L 2924/01029* (2013.01); *H01L 2924/01047* (2013.01); *H01L 2924/13091* (2013.01)

(56) References Cited

U.S. PATENT DOCUMENTS

| | | | |
|---|---|---|---|
| 9,129,981 B2 | 9/2015 | Yap et al. | |
| 9,536,834 B2 | 1/2017 | Chou et al. | |
| 2004/0012090 A1* | 1/2004 | Basol | H01L 21/2885 257/755 |
| 2005/0029010 A1* | 2/2005 | Ahn | H01L 21/76877 174/255 |
| 2005/0070090 A1 | 3/2005 | Lee et al. | |
| 2005/0124153 A1 | 6/2005 | Cohen | |
| 2006/0091551 A1* | 5/2006 | Lin | C25D 3/58 257/762 |
| 2008/0286965 A1 | 11/2008 | Lee et al. | |
| 2009/0200662 A1 | 8/2009 | Ng et al. | |
| 2009/0309212 A1 | 12/2009 | Shim et al. | |
| 2012/0248614 A1* | 10/2012 | Gandhi | H01L 23/293 257/762 |
| 2012/0306084 A1* | 12/2012 | Wood | H01L 21/76898 257/761 |
| 2014/0131841 A1* | 5/2014 | Tseng | H01L 23/481 257/621 |
| 2015/0001720 A1 | 1/2015 | Lin et al. | |
| 2015/0115465 A1* | 4/2015 | Lin | H01L 21/568 257/774 |
| 2015/0126030 A1 | 5/2015 | Yang et al. | |
| 2015/0200126 A1 | 7/2015 | Chen et al. | |

\* cited by examiner

INTERCONNECT STRUCTURE AND METHOD OF FORMING SAME

This application is a continuation of U.S. patent application Ser. No. 15/613,579, filed on Jun. 5, 2017, entitled "Interconnect Structure and Method of Forming Same", which is a continuation of U.S. patent application Ser. No. 14/991,560, filed on Jan. 8, 2016, entitled "Interconnect Structure and Method of Forming Same", now U.S. Pat. No. 9,679,859, issued on Jun. 13, 2017, which application is a divisional of U.S. patent application Ser. No. 14/158,364, filed on Jan. 17, 2014, entitled "Interconnect Structure and Method of Forming Same", now U.S. Pat. No. 9,252,110, issued on Feb. 2, 2016, which applications are incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for even smaller electronic devices has grown recently, there has grown a need for smaller and more creative packaging techniques of semiconductor dies.

As semiconductor technologies evolve, three-dimensional (3D) integrated circuits (ICs) have emerged as an effective alternative to further reduce the physical size of a semiconductor chip. A 3D IC may comprise a variety of semiconductor dies stacked together. In particular, the semiconductor dies may be bonded together through a plurality of micro bumps and electrically coupled to each other through a plurality of through vias. For example, active circuits such as logic, memory, processor circuits and the like are fabricated on different wafers and each wafer die is stacked on top of another wafer die using pick-and-place techniques. Through vias are thus used in the stacked dies for connecting dies. In some cases, through vias are often used to connect the integrated circuits on a die to the backside of the die.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the embodiments of the disclosure, and do not limit the scope of the disclosure.

The present disclosure will be described with respect to embodiments in a specific context, namely an interconnect structure of a semiconductor device. The embodiments of the disclosure may also be applied, however, to a variety of semiconductor devices of the semiconductor industry. Hereinafter, various embodiments will be explained in detail with reference to the accompanying drawings.

Figure 1:
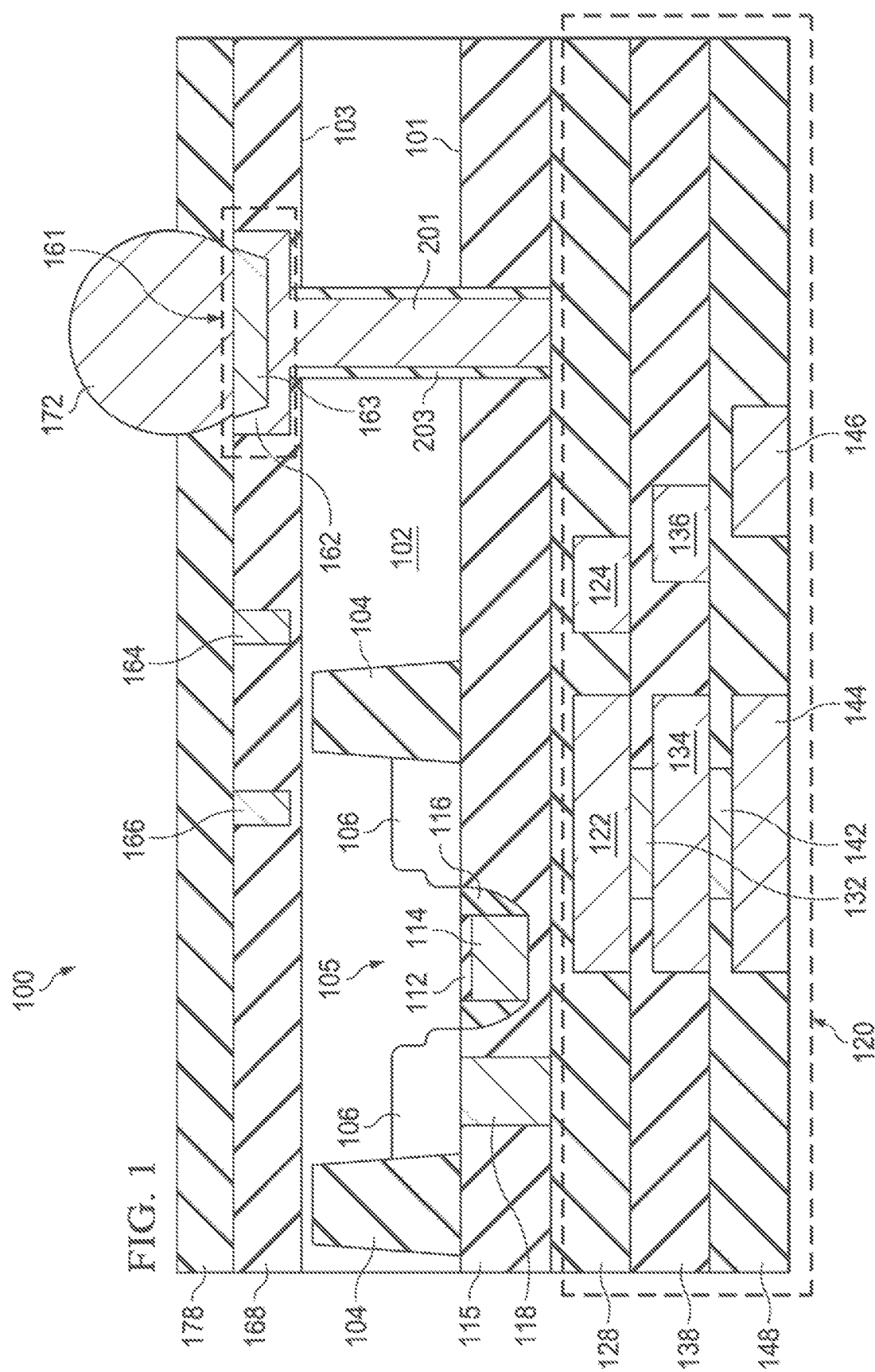
FIG. 1 illustrates a cross sectional view of a semiconductor device in accordance with various embodiments of the present application.

FIG. 1 illustrates a cross sectional view of a semiconductor device in accordance with various embodiments of the present application. The semiconductor device 100 comprises a front side interconnect structure 120. The front side interconnect structure 120 may comprise a plurality of metal lines (e.g., metal lines 122, 124, 134, 136, 144 and 146) and vias (e.g., vias 132 and 142). The front side interconnect structure 120 may further comprise metal pads, redistribution lines, bumps (not shown respectively) and/or the like.

As shown in FIG. 1, the front side interconnect structure 120 is formed over a first side 101 of a substrate 102. The substrate 102 may comprise a variety of electrical circuits (e.g., transistor 105) and through vias (e.g. through via 201). The electrical circuits are formed within and on the first side 101 of the substrate 102. Throughout the description, the first side 101 may be alternatively referred to as the front side of the substrate 102. The second side 103 may be alternatively referred to as the backside of the substrate 102.

The semiconductor device 100 further comprises a plurality of backside interconnect structures (e.g., backside bump 172). As shown in FIG. 1, the backside bump 172 is formed over the second side 103 of the substrate 102. In particular, the bump 172 is formed on a pad 161. As shown in FIG. 1, the pad 161 includes two portions, namely an upper portion 163 and a bottom portion 162. In some embodiments, the upper portion 163 is of a trapezoidal shape. The sidewalls of the upper portion 163 are surrounded by the bottom portion 162. The bottom portion 162 may be a redistribution line according to some embodiments.

In some embodiments, the upper portion 163 is formed of nickel. The bottom portion 162 is formed of copper. The detailed formation process of the pad 161 will be described below with respect to FIGS. 2-9.

The backside interconnect structures may further comprise a plurality of redistribution lines 164 and 166. Throughout the description, the redistribution lines 164 and 166 are alternatively referred to as metal lines 164 and 166. In some embodiments, the metal lines 164 and 166 are formed of copper. As shown in FIG. 1, the top surfaces of the metal lines 164 and 166 are substantially level with the top surface of the pad 161.

The through via 201 is formed in the substrate 102. More particularly, the through via 201 extends through the substrate 102 from the first side 101 of the substrate 102 to the second side 103 of the substrate 102. As shown in FIG. 1, the through via 201 provides a conductive channel between the front side interconnect structure 120 and the backside interconnect structure (e.g., bump 172).

The through via 201 may be formed in a via opening, which extends deeper than the depth of the electrical circuits (e.g., MOS transistor 105) of the semiconductor device 100. In order to insulate the conductive material of the through via 201 from the substrate 102, a liner layer 203 is formed on the sidewalls of the via opening. A barrier (not shown) is formed over the liner layer 203. Furthermore, in order to facilitate the plating process, a seed layer (not shown) may be formed over the barrier layer. A conductive material such as copper may fill the via opening to form the through via 201 through a plating process.

The substrate 102 may be formed of silicon, although it may also be formed of other group III, group IV, and/or group V elements, such as silicon, germanium, gallium, arsenic, and combinations thereof.

The substrate 102 may also be in the form of silicon-on-insulator (SOI). The SOI substrate may comprise a layer of a semiconductor material (e.g., silicon, germanium and/or the like) formed over an insulator layer (e.g., buried oxide or the like), which is formed in a silicon substrate. In addition, other substrates that may be used include multi-layered substrates, gradient substrates, hybrid orientation substrates and/or the like.

The substrate 102 may further comprise a variety of electrical circuits (e.g., transistor 105). The electrical circuits formed on the substrate 102 may be any type of circuitry suitable for a particular application. In accordance with an embodiment, the electrical circuits may include various n-type metal-oxide semiconductor (NMOS) and/or p-type metal-oxide semiconductor (PMOS) devices such as transistors, capacitors, resistors, diodes, photo-diodes, fuses and/or the like. The electrical circuits may be interconnected to perform one or more functions. The functions may include memory structures, processing structures, sensors, amplifiers, power distribution, input/output circuitry and/or the like.

As shown in FIG. 1, a metal oxide semiconductor (MOS) transistor 105 and its associated contact plug 118 are used to represent the electrical circuits of the semiconductor device 100. The MOS transistor 105 is formed in the substrate 102. The MOS transistor 105 includes two drain/source regions 106. As shown in FIG. 1, the drain/source regions 106 are formed on opposite sides of a gate stack. The gate stack includes a gate dielectric layer 112 formed over the substrate 102, a gate electrode formed over the gate dielectric layer 112 and gate spacers 116. As shown in FIG. 1, there may be two isolation regions 104 formed on opposite sides of the MOS transistor 105.

The isolation regions 104 may be shallow trench isolation (STI) regions, and may be formed by etching the substrate 102 to form a trench and filling the trench with a dielectric material as is known in the art. For example, the isolation regions 104 may be filled with a dielectric material such as an oxide material, a high-density plasma (HDP) oxide and/or the like. A planarization process such as a chemical mechanical polishing (CMP) process may be applied to the top surface so that the excess dielectric material may be removed as a result.

The gate dielectric 112 may be a dielectric material such as silicon oxide, silicon oxynitride, silicon nitride, an oxide, a nitrogen-containing oxide, a combination thereof and/or the like. The gate dielectric 112 may have a relative permittivity value greater than about 4. Other examples of such materials include aluminum oxide, lanthanum oxide, hafnium oxide, zirconium oxide, hafnium oxynitride, combinations thereof and/or the like. In an embodiment in which the gate dielectric 112 comprises an oxide layer, the gate dielectrics 112 may be formed by a plasma enhanced chemical vapor deposition (PECVD) process using tetraethoxysilane (TEOS) and oxygen as a precursor. In accordance with an embodiment, the gate dielectric 112 may be of a thickness in a range from about 8 Å to about 200 Å.

The gate electrode 114 may comprise a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, combinations thereof and/or the like. In an embodiment in which the gate electrode 114 is poly-silicon, the gate electrode 114 may be formed by depositing doped or undoped poly-silicon by low-pressure chemical vapor deposition (LPCVD) to a thickness in the range of about 400 Å to about 2,400 Å.

The spacers 116 may be formed by blanket depositing one or more spacer layers (not shown) over the gate electrode 114 and the substrate 102. The spacer layers 116 may comprise suitable dielectric materials such as SiN, oxynitride, SiC, SiON, oxide and/or the like. The spacer layers 116 may be formed by commonly used techniques such as chemical vapor deposition (CVD), PECVD, sputter and/or the like.

The drain/source regions 106 may be formed in the substrate 102 on opposing sides of the gate dielectric 112. In an embodiment in which the substrate 102 is an n-type substrate, the drain/source regions 106 may be formed by implanting appropriate p-type dopants such as boron, gallium, indium and/or the like. Alternatively, in an embodiment in which the substrate 102 is a p-type substrate, the drain/source regions 106 may be formed by implanting appropriate n-type dopants such as phosphorous, arsenic and/or the like.

An interlayer dielectric layer 115 is formed on the first side 101 of the substrate 102. The interlayer dielectric layer 115 may be formed, for example, of a low-K dielectric material, such as silicon oxide. The interlayer dielectric layer 115 may be formed by any suitable method known in the art, such as spinning, CVD and PECVD). It should also be noted that one skilled in the art will recognize while FIG.

1 illustrates a single interlayer dielectric layer, the interlayer dielectric layer 115 may comprise a plurality of dielectric layers.

As shown in FIG. 1, the interlayer dielectric layer 115 is formed on the first side 101 of the substrate 102. There may be a contact plug 118 formed in the interlayer dielectric layer 115. The contact plug 118 is formed through the interlayer dielectric layer 115 to provide an electrical connection between the MOS transistor 105 and the front side interconnect structure 120 formed over the interlayer dielectric layer 115.

The contact plug 118 may be formed by using photolithography techniques to deposit and pattern a photoresist material on the interlayer dielectric layer 115. A portion of the photoresist is exposed according to the location and shape of the contact plug 118. An etching process, such as an anisotropic dry etch process, may be used to create an opening in the interlayer dielectric layer 115.

A conductive liner may be deposited prior to filling the contact plug hole. The conductive liner is preferably conformal, and may comprise a single layer of Ta, TaN, WN, WSi, TiN, Ru and any combinations thereof. The conductive liner may be typically used as a barrier layer for preventing the conductive material such as copper from diffusing into the underlying substrate 102. The conductive liner may be deposited by using suitable deposition process such as CVD, PVD, Atomic Layer Deposition (ALD) and/or the like.

A conductive material is then filled in the opening. The conductive material may be deposited by using CVD, PVD or ALD. The conductive material is deposited over the conductive liner to fill the contact plug opening. Excess portions of the conductive material are removed from the top surface of the interlayer dielectric layer 115 by using a planarization process such as CMP. The conductive material may be copper, tungsten, aluminum, silver, titanium, titanium nitride, tantalum and combinations thereof and/or the like.

The front side interconnect structure 120 may comprise a plurality of metal lines. The metal lines may be formed in different layers and separated by inter-layer dielectric layers and inter-metal dielectrics layers. The semiconductor device 100 may include up to eight metallization layers, or even more. The metallization layer immediately over the interlayer dielectric layer 115 is referred to as the bottom metallization layer (M1), and the metallization layer in which bond pads (not shown) are formed is referred to as the top metallization layer (TM).

As shown in FIG. 1, the bottom inter-metal dielectric layer 128 is formed over the interlayer dielectric layer 115. There may be two metal lines 122 and 124 embedded in the inter-layer dielectric layer 115. The metal lines 122 and 124 may be formed through a damascene process, whereby masks are deposited onto the surface of the bottom inter-metal dielectric layer 128, holes are etched into the surface, and conductive material (such as tungsten or copper) is used to fill the holes.

The bottom inter-metal dielectric layer 128 may be formed of a low-K dielectric material such as fluorosilicate glass (FSG) and/or the like. The inter-metal dielectric layer 128 may be formed by suitable deposition techniques such as PECVD, high-density plasma chemical vapor deposition (HDPCVD) and/or the like.

It should be noted that the semiconductor device 100 may accommodate any number of metallization layers. For simplicity, only three metallization layers are illustrated herein. The inter-metal dielectric layer 138 and the inter-metal dielectric layer 148 are similar to the bottom inter-metal dielectric layer 128 except that metal lines (e.g., metal lines 134 and 144) and their adjacent vias (e.g., vias 132 and 142) of the semiconductor device 100 are formed in a dual damascene structure.

Figure 2:
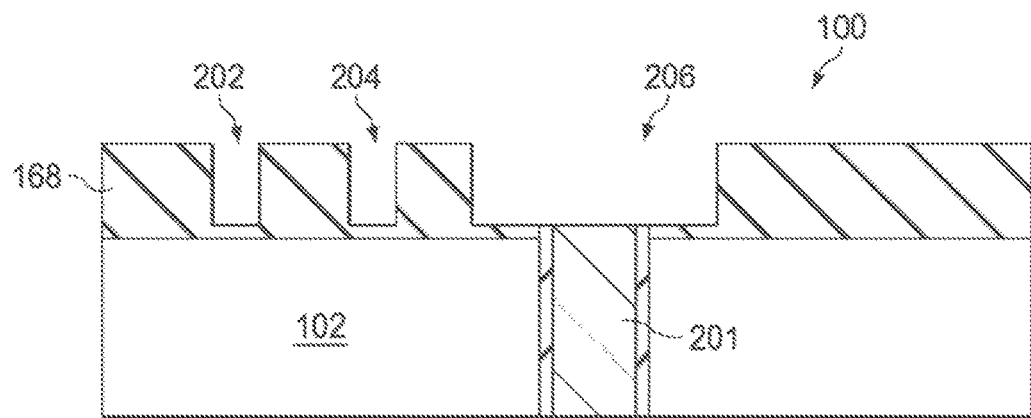
FIG. 2 illustrates a cross sectional view of forming a plurality of openings in a dielectric layer in accordance with various embodiments of the present disclosure.

FIGS. 2 to 9 illustrate intermediate steps of fabricating the semiconductor device shown in FIG. 1 in accordance with various embodiments of the present disclosure. For simplicity, only the backside structures and the substrate 102 are included in FIGS. 2 to 9. FIG. 2 illustrates a cross sectional view of forming a plurality of openings in a dielectric layer in accordance with various embodiments of the present disclosure. A dielectric layer 168 is formed over the backside of the substrate 102. The dielectric material may comprise polybenzoxazole (PBO), SU-8 photo-sensitive epoxy, film type polymer materials and/or the like.

In consideration of the locations of the metal lines (e.g., metal lines 164 and 166) and the pad 161 shown in FIG. 1, selective areas of the dielectric layer 168 are exposed to light. As a result, a variety of openings (e.g., opening 202, 204 and 206) are formed. Throughout the description, the openings 202 and 204 are alternatively referred to as metal line openings. The opening 206 is alternatively referred to as a redistribution line opening.

As shown in FIG. 2, the top surface of the through via 201 is exposed after the opening 206 is formed. The formation of the openings such as openings 202, 204 and 206 in the dielectric layer 168 involves various lithography operations, which are well known, and hence are not discussed in further detail herein. One advantageous feature of the formation process described above is that the metal lines and the pad are formed through one single patterning process. Such a single patterning process helps to reduce the fabrication cost of the semiconductor device 100.

Figure 3:
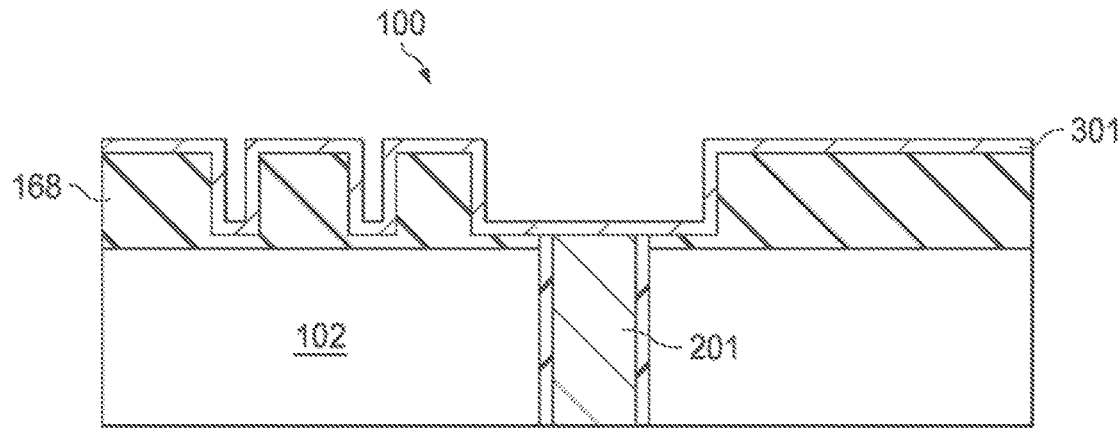
FIG. 3 a cross sectional view of the semiconductor device shown in FIG. 2 after a seed layer is formed on top of the dielectric layer in accordance with various embodiments of the present disclosure.

FIG. 3 illustrates a cross sectional view of the semiconductor device shown in FIG. 2 after a seed layer is formed on top of the dielectric layer in accordance with various embodiments of the present disclosure. The seed layer 301 is formed over the dielectric layer 168. The seed layer 301 may comprise two portions, namely a bottom seed layer (not shown) and an upper seed layer (not shown). The bottom seed layer may be a titanium layer, a titanium nitride layer, a tantalum layer, a tantalum nitride layer and/or the like. The upper seed layer may be formed of copper, copper alloys and/or the like. In accordance with an embodiment, the seed layer 301 may be formed using any suitable techniques such as CVD, PVD and/or the like. It is should be noted that the seed layer 301 is electrically coupled to the through via 201 after the seed layer 301 is formed over the dielectric layer 168.

Figure 4:
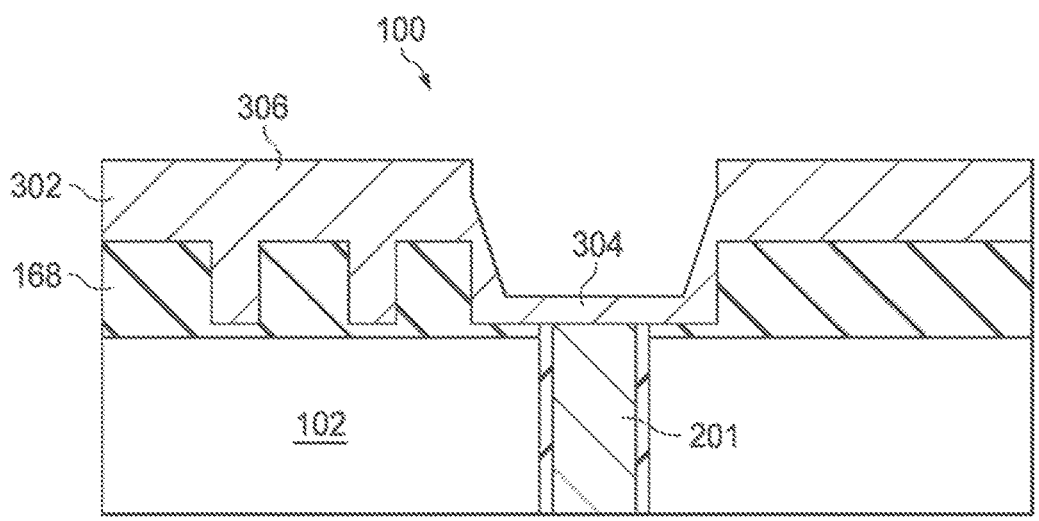
FIG. 4 illustrates a cross sectional view of the semiconductor device shown in FIG. 3 after a first metal layer is formed on top of the seed layer in accordance with various embodiments of the present disclosure.

FIG. 4 illustrates a cross sectional view of the semiconductor device shown in FIG. 3 after a first metal layer is formed on top of the seed layer in accordance with various embodiments of the present disclosure. As shown in FIG. 4, a first conductive material may be filled in the openings (e.g., openings 202 and 204 shown in FIG. 2) and partially filled in the opening 206 (shown in FIG. 2). The first metal layer 302 is formed through a plating process according to some embodiments.

The first conductive material may be copper, but can be any suitable conductive materials, such as copper alloys, aluminum, tungsten, silver, any combinations thereof and/or the like.

In some embodiments, the first metal layer 302 is formed of copper. The metal line openings 202 and 204 are filled with copper and the redistribution line opening 206 is partially filled with copper through a first plating process. The first plating process is controlled such that the first metal layer 302 is of an uneven thickness. As shown in FIG. 4, the first metal layer 302 may be divided into two portions. The first portion 304 is thinner than a second portion 306. In some embodiments, a ratio of a thickness of the second portion 306 to a thickness of the first portion 304 is greater than 2.

Figure 5:
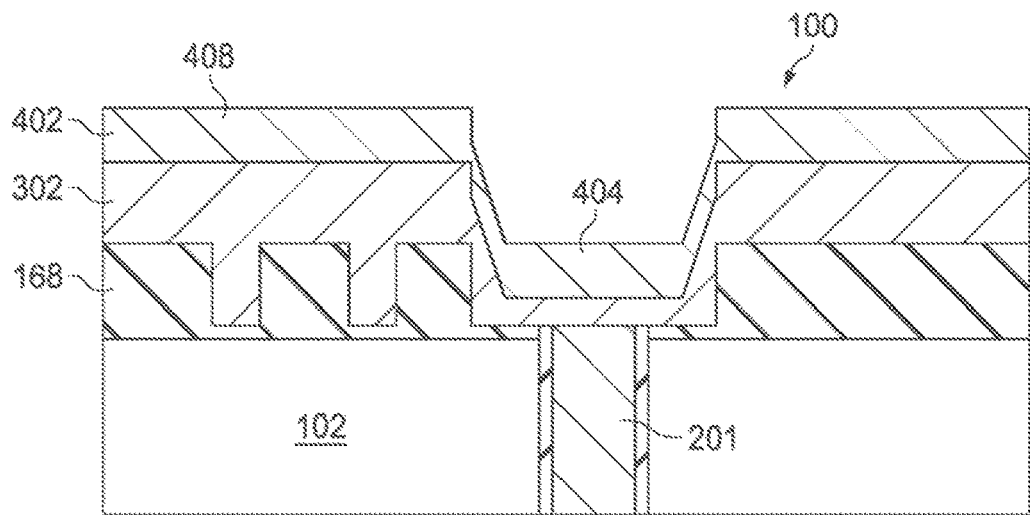
FIG. 5 illustrates a cross sectional view of the semiconductor device shown in FIG. 4 after a second metal layer is formed on top of the first metal layer in accordance with various embodiments of the present disclosure.

FIG. 5 illustrates a cross sectional view of the semiconductor device shown in FIG. 4 after a second metal layer is formed on top of the first metal layer in accordance with various embodiments of the present disclosure. As shown in FIG. 5, a second conductive material may be deposited in a conformal manner on top of the first metal layer 302 to form an additional conductive layer 402. The conductive material may be nickel, but can be any suitable conductive materials, such as copper alloys, aluminum, tungsten, silver, any combinations thereof and/or the like.

In some embodiments, the second metal layer 402 is formed of nickel. The second metal layer 402 may be formed by suitable techniques such as a second plating process. In some embodiments, the second plating process is controlled such that the second conductive layer 402 is of a substantially uniform thickness. In other words, the thickness of the portion 404 (the portion in the opening 206) is approximately equal to the thickness of the portion 408.

Figure 6:
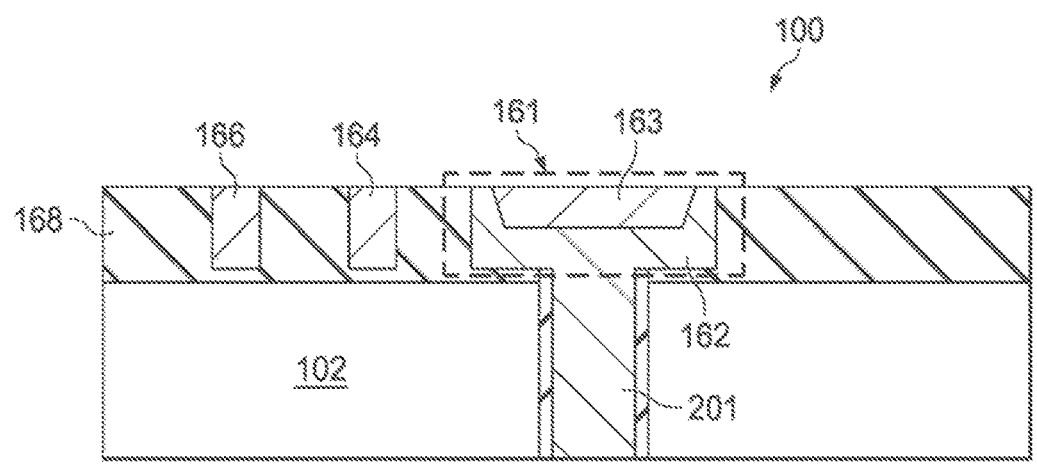
FIG. 6 is a cross sectional view of the semiconductor device illustrated in FIG. 5 after a chemical mechanical polish (CMP) process has been applied to the backside of the substrate in accordance with various embodiments of the present disclosure.

FIG. 6 is a cross sectional view of the semiconductor device illustrated in FIG. 5 after a CMP process has been applied to the backside of the substrate in accordance with various embodiments of the present disclosure. The first metal layer 302 and the second metal layer 402 are planarized until the top surface of the pad 601 is substantially level with the top surfaces of the metal lines 164 and 166. As shown in FIG. 6, after the planarization process, two metal lines (e.g., metal lines 164 and 166) and a pad (e.g., pad 161) are formed in the dielectric layer 168. As shown in FIG. 6, the height of the metal lines 164 and 166 is approximately equal to the height of the pad 601. Such an equal height feature may help a user to accurately create a SPICE model.

The planarization process may be implemented by using suitable techniques such as grinding, polishing and/or chemical etching, a combination of etching and grinding techniques. In accordance with an embodiment, the thinning process may be implemented by using a CMP process. In the CMP process, a combination of etching materials and abrading materials are put into contact with the backside of the substrate and a grinding pad (not shown) is used to grind away the first metal layer 302 and the second metal layer 402 until the top surface of the dielectric layer 168 is exposed.

Figure 7:
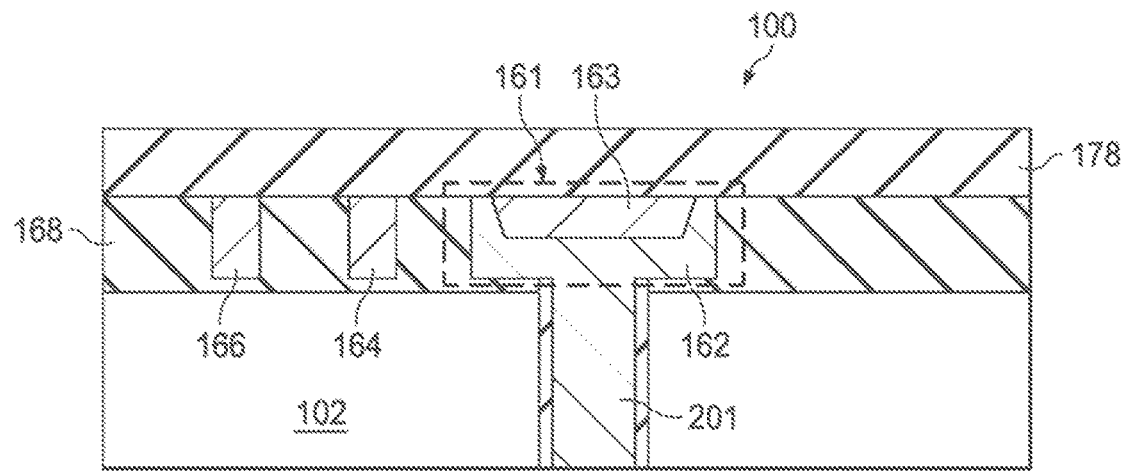
FIG. 7 illustrates a cross sectional view of the semiconductor device shown in FIG. 6 after a passivation layer is formed over the semiconductor device in accordance with various embodiments of the present disclosure.

FIG. 7 illustrates a cross sectional view of the semiconductor device shown in FIG. 6 after a passivation layer is formed over the semiconductor device in accordance with various embodiments of the present disclosure. The passivation layer 178 may comprise a dielectric material such as an oxide or silicon nitride, silicon oxynitride, although other suitable dielectrics, such as a high-k dielectric, may alternatively be used. The passivation layer 178 may be formed through any suitable techniques such as CVD, PECVD and/or the like.

Figure 8:
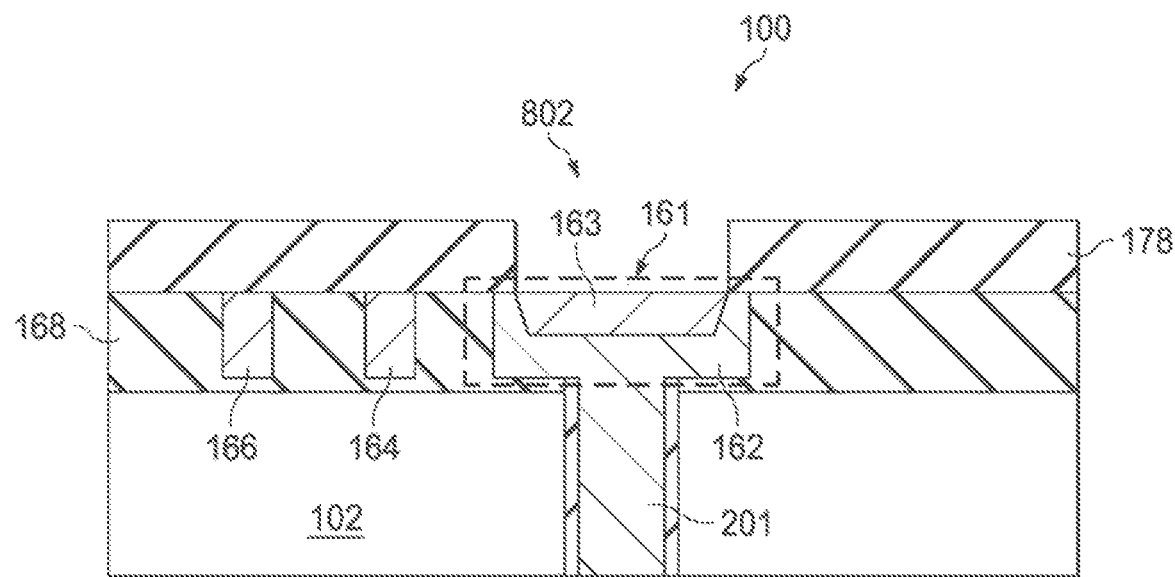
FIG. 8 illustrates a cross sectional view of the semiconductor device shown in FIG. 7 after an opening is formed in the passivation layer in accordance with various embodiments of the present disclosure.

FIG. 8 illustrates a cross sectional view of the semiconductor device shown in FIG. 7 after an opening is formed in the passivation layer in accordance with various embodiments of the present disclosure. Once the passivation layer 178 is deposited on the backside of the substrate 102, in order to expose at least a portion of the pad 161, a patterning process may be applied to the passivation layer 178. A suitable etching technique may be applied to the passivation layer 178. As a result, the opening 802 is formed and the top surface of the pad 161 is exposed.

Figure 9:
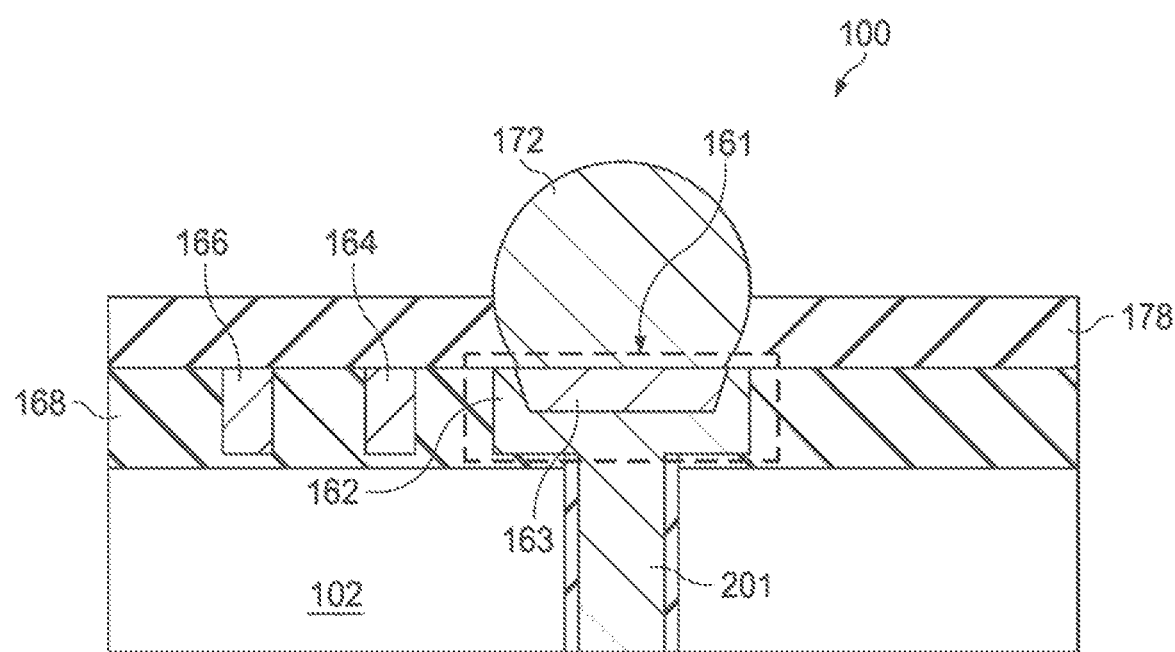
FIG. 9 illustrates a cross section view of the semiconductor device shown in FIG. 8 after an interconnect bump is formed on the backside contact in accordance with various embodiments of the present disclosure.

FIG. 9 illustrates a cross section view of the semiconductor device shown in FIG. 8 after an interconnect bump is formed on the backside contact in accordance with various embodiments of the present disclosure. The bump 172 provides an effective way to connect the semiconductor device with external circuits (not shown). In accordance with an embodiment, the bump 172 may be a solder ball. The solder ball 172 may be made of any of suitable materials. In accordance with an embodiment, the solder ball 172 may comprise SAC405. SAC405 comprises 95.5% Sn, 4.0% Ag and 0.5% Cu.

In accordance with another embodiment, the bump 172 may be a copper bump. The copper bump may be of a height of approximately 45 um. The copper bump may be formed by using a variety of semiconductor packaging technologies such as sputtering, electroplating and/or the like.

In accordance with an embodiment, a device comprises a first side interconnect structure over a first side of a substrate, wherein active circuits are in the substrate and adjacent to the first side of the substrate, a dielectric layer over a second side of the substrate, a pad embedded in the dielectric layer, the pad comprising an upper portion and a bottom portion formed of two different materials and a passivation layer over the dielectric layer.

In accordance with an embodiment, a device comprises a dielectric layer over a backside of a substrate comprising active circuits, a pad in the dielectric layer, wherein the pad comprises an upper portion and a bottom portion formed of two different materials and sidewalls of the upper portion are surrounded by the bottom portion and a passivation layer over the dielectric layer, wherein the bottom portion is in contact with the passivation layer.

In accordance with an embodiment, a device comprises a front side interconnect structure over a front side of a substrate, an interlayer dielectric layer between the substrate and the front side interconnect structure, a dielectric layer over a backside of the substrate, a pad in the dielectric layer, the pad comprising an upper portion and a bottom portion formed of two different materials and a passivation layer over the dielectric layer.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A device comprising:
   a first side interconnect structure over a first side of a substrate, wherein active circuits are in the substrate and adjacent to the first side of the substrate;

a dielectric layer over a second side of the substrate;
a via partially extending through the dielectric layer;
a pad embedded in the dielectric layer, the pad comprising an upper portion and a bottom portion, the bottom portion being formed of a first conductive material, the upper portion being formed of a second conductive material different than the first conductive material, wherein sidewalls of the upper portion are completely covered by the bottom portion;
a first metal line embedded in the dielectric layer, the first metal line being formed of the first conductive material, wherein an entirety of an upper surface of the first conductive material of the first metal line is planar with an upper surface of the first conductive material of the pad and an upper surface of the second conductive material of the pad; and
a passivation layer over the dielectric layer, and wherein the pad is in the dielectric layer, and the bottom portion of the pad is in contact with the via and the passivation layer.

2. The device of claim 1, wherein:
a width of the pad is greater than a width of a first metal line embedded in the dielectric layer.

3. The device of claim 1, further comprising:
an isolation region in the substrate; and
a second metal line embedded in the dielectric layer, wherein a distance between the first metal line and the isolation region is substantially equal to a distance between the isolation region and the second metal line.

4. The device of claim 1, wherein sidewalls of the upper portion of the pad are tapered.

5. The device of claim 1, wherein:
the first conductive material is copper; and
the second conductive material is nickel.

6. The device of claim 1, further comprising:
a bump over the pad, wherein a bottom portion of the bump is surrounded by the passivation layer.

7. A device comprising:
a dielectric layer over a backside of a substrate comprising active circuits;
a via extending through the substrate and partially through the dielectric layer;
a pad in the dielectric layer and in contact with the via, wherein:
the pad comprises an upper portion and a bottom portion formed of two different materials; and
sidewalls of the upper portion are surrounded by the bottom portion; and
a passivation layer over the dielectric layer, wherein the bottom portion is in contact with the passivation layer.

8. The device of claim 7, further comprising:
a surface of the upper portion of the pad is substantially level with a surface of the dielectric layer.

9. The device of claim 7, further comprising:
a plurality of metal lines in the dielectric layer, wherein:
top surfaces of the plurality of metal lines are substantially level with a top surface of the pad; and
bottom surfaces of the plurality of metal lines are substantially level with a bottom surface of the pad.

10. The device of claim 9, further comprising:
an interlayer dielectric layer over a front side of the substrate, wherein a gate is formed in the interlayer dielectric layer.

11. The device of claim 10, further comprising:
a front side interconnect structure over the front side of the substrate, wherein the front side interconnect structure is connected to the active circuits through the via and the plurality of metal lines.

12. The device of claim 9, further comprising:
a bump over the upper portion of the pad, wherein the bump and the bottom portion of the pad are separated by the passivation layer.

13. A device comprising:
a front side interconnect structure over a front side of a substrate;
an interlayer dielectric layer between the substrate and the front side interconnect structure;
a dielectric layer over a backside of the substrate;
a via extending into the dielectric layer;
a redistribution line extending into the dielectric layer;
a pad in the dielectric layer, the pad comprising an upper portion and a bottom portion formed of two different materials, wherein sidewalls of the upper portion of the pad are tapered, the bottom portion and the redistribution line being formed of a same material, an upper surface of the redistribution line being free of a material of the upper portion, the upper surface of the redistribution line, an upper surface of the bottom portion, and an upper surface of the upper portion being planar; and
a passivation layer over the dielectric layer.

14. The device of claim 13, wherein:
the via extends through the interlayer dielectric layer and the substrate.

15. The device of claim 14, wherein:
the via is in contact with the bottom portion of the pad.

16. The device of claim 13, wherein:
sidewalls of the upper portion of the pad are surrounded by the bottom portion of the pad.

17. The device of claim 13, wherein:
a surface of the bottom portion of the pad is in contact with the passivation layer.

18. The device of claim 13, wherein:
the bottom portion of the pad is between and in contact with the via and the passivation layer.

19. The device of claim 1, wherein:
the via extends through the substrate.

20. The device of claim 7, wherein sidewalls of the upper portion are tapered.

* * * * *